United States Patent
Noble et al.

(10) Patent No.: US 6,492,694 B2
(45) Date of Patent: *Dec. 10, 2002

(54) HIGHLY CONDUCTIVE COMPOSITE POLYSILICON GATE FOR CMOS INTEGRATED CIRCUITS

(75) Inventors: Wendell P. Noble, Milton, VT (US); Leonard Forbes, Corvallis, OR (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/031,637

(22) Filed: Feb. 27, 1998

(65) Prior Publication Data

US 2002/0014660 A1 Feb. 7, 2002

(51) Int. Cl.⁷ .......................... H01L 29/76; H01L 29/94; H01L 31/062; H01L 31/113; H01L 31/119
(52) U.S. Cl. ...................... 257/410; 257/411; 257/412; 257/413; 257/751
(58) Field of Search ............................... 257/412, 413, 257/408, 751, 761, 765, 762, 411, 410

(56) References Cited

U.S. PATENT DOCUMENTS

| | | | |
|---|---|---|---|
| 3,571,674 A | 3/1971 | Yu et al. | 317/235 |
| 3,932,226 A | 1/1976 | Klatskin et al. | 204/16 |
| 4,157,269 A | 6/1979 | Ning et al. | 148/1.5 |
| 4,169,000 A | 9/1979 | Riseman | 148/187 |
| 4,234,357 A | 11/1980 | Scheppele | 148/1.5 |
| 4,252,582 A | 2/1981 | Anantha et al. | 148/175 |

(List continued on next page.)

FOREIGN PATENT DOCUMENTS

| | | | |
|---|---|---|---|
| JP | 61-125081 | 6/1986 | H01L/29/76 |
| JP | 62-160750 | 7/1987 | H01L/27/04 |

(List continued on next page.)

OTHER PUBLICATIONS

Moffatt, W.G., *The Handbook of Binary Phase Diagrams*, General Electric Company, pp. 11/84, 3/84, (1978).
Moffatt, W.G., *The Handbook of Binary Phase Diagrams*, 2, Genium Publishing Corporation, p. 6/80, (1984).

(List continued on next page.)

*Primary Examiner*—Steven Loke
(74) *Attorney, Agent, or Firm*—Schwegman, Lundberg, Woessner & Kluth, P.A.

(57) ABSTRACT

Many integrated circuits include a type of transistor known as a metal-oxide-semiconductor, field-effect transistor, or "mosfet," which has an insulated gate member that controls its operation. Early mosfets had aluminum gates. But because the aluminum made the mosfets unreliable and difficult to manufacture, aluminum was abandoned in favor of polysilicon. Unfortunately, polysilicon has ten-times more electrical resistance than aluminum, which not only wastes power but also slows operation of the integrated circuits. Several efforts have been made to use materials less-resistive than polysilicon, but these have failed to yield a practical solution, since some of the materials have high electrical resistance and prevent low-voltage operation. Accordingly, one embodiment of the invention provides a gate structure that includes a doped polysilicon layer to facilitate low-voltage operation, a diffusion barrier to improve reliability, and a low-resistance aluminum, gold, or silver member to reduce gate resistance. Moreover, to overcome previous manufacturing difficulties, the inventors employ a metal-substitution fabrication technique, which entails formation of a polysilicon gate, and then substitution of metal for the polysilicon.

41 Claims, 4 Drawing Sheets

U.S. PATENT DOCUMENTS

| | | | | |
|---|---|---|---|---|
| 4,333,111 | A | 6/1982 | Noda et al. | 358/213 |
| 4,388,532 | A | 6/1983 | Garcia | 250/578 |
| 4,413,284 | A | 11/1983 | Izumita et al. | 358/213 |
| 4,442,449 | A | 4/1984 | Lehrer et al. | 357/67 |
| 4,470,852 | A | 9/1984 | Ellsworth | 148/1.5 |
| 4,483,726 | A | 11/1984 | Isaac et al. | 148/187 |
| 4,484,210 | A | 11/1984 | Shiraki et al. | 357/24 |
| 4,507,673 | A | 3/1985 | Aoyama et al. | 357/23 R |
| 4,507,847 | A | 4/1985 | Sullivan | 29/576 |
| 4,651,409 | A | 3/1987 | Ellsworth et al. | 29/576 B |
| 4,670,297 | A | 6/1987 | Lee et al. | 427/91 |
| 4,686,373 | A | 8/1987 | Tew et al. | 250/578 |
| 4,702,941 | A | 10/1987 | Mitchell et al. | 427/250 |
| 4,800,177 | A | 1/1989 | Nakamae | 437/193 |
| 4,809,075 | A | 2/1989 | Akimoto et al. | 358/213.18 |
| 4,855,252 | A | 8/1989 | Peterman | 437/189 |
| 4,857,481 | A | 8/1989 | Tam et al. | 437/182 |
| 4,893,273 | A | 1/1990 | Usami | 365/185 |
| 4,908,518 | A | 3/1990 | Losee et al. | 358/213.23 |
| 4,959,705 | A | 9/1990 | Lemnious | 27/522 |
| 4,984,047 | A | 1/1991 | Stevens | 357/30 |
| 5,010,039 | A | 4/1991 | Ku et al. | 437/228 |
| 5,021,663 | A | 6/1991 | Hornbeck | 250/349 |
| 5,040,049 | A | 8/1991 | Raaijmakers | 357/71 |
| 5,051,797 | A | 9/1991 | Erhardt | 357/24 |
| 5,051,805 | A | 9/1991 | Custode | 357/34 |
| 5,060,245 | A | 10/1991 | Nelson | 377/60 |
| 5,111,430 | A | 5/1992 | Morie | 365/185 |
| 5,115,458 | A | 5/1992 | Burkey et al. | 377/58 |
| 5,148,260 | A | 9/1992 | Inoue et al. | 257/276 |
| 5,158,986 | A | 10/1992 | Cha et al. | 521/82 |
| 5,182,623 | A | 1/1993 | Hynecek | 257/230 |
| 5,187,560 | A | 2/1993 | Yoshida et al. | 257/743 |
| 5,192,990 | A | 3/1993 | Stevens | 257/229 |
| 5,202,907 | A | 4/1993 | Yonemoto | 377/60 |
| 5,235,196 | A | 8/1993 | Anagnostopoulos et al. | 257/223 |
| 5,235,198 | A | 8/1993 | Stevens et al. | 257/232 |
| 5,241,193 | A | 8/1993 | Pfiester et al. | 257/67 |
| 5,256,891 | A | 10/1993 | Losee et al. | 257/233 |
| 5,260,593 | A | 11/1993 | Lee | 257/316 |
| 5,262,871 | A | 11/1993 | Wilder et al. | 358/213.11 |
| 5,268,315 | A | 12/1993 | Prasad et al. | 437/31 |
| 5,280,188 | A | 1/1994 | Iwasaki | 257/370 |
| 5,293,560 | A | 3/1994 | Harari | 365/185 |
| 5,306,931 | A | 4/1994 | Stevens | 257/223 |
| 5,308,440 | A | 5/1994 | Chino et al. | 156/664 |
| 5,317,535 | A | 5/1994 | Talreja et al. | 365/185 |
| 5,324,684 | A | 6/1994 | Kermani et al. | 437/95 |
| 5,334,356 | A | 8/1994 | Baldwin et al. | 422/133 |
| 5,337,340 | A | 8/1994 | Hynecek | 377/60 |
| 5,341,016 | A | 8/1994 | Prall et al. | 257/412 |
| 5,359,213 | A | 10/1994 | Lee et al. | 257/223 |
| 5,369,039 | A | 11/1994 | Hynecek | 437/2 |
| 5,369,040 | A | 11/1994 | Halvis et al. | 437/3 |
| 5,371,035 | A | 12/1994 | Pfiester et al. | 437/69 |
| 5,388,069 | A | 2/1995 | Kokubo | 365/185 |
| 5,389,833 | A | 2/1995 | Kay | 327/96 |
| 5,391,911 | A | 2/1995 | Beyer et al. | 257/522 |
| 5,399,889 | A | 3/1995 | Miyake et al. | 257/292 |
| 5,424,993 | A | 6/1995 | Lee et al. | 365/218 |
| 5,436,496 | A | 7/1995 | Jerome et al. | 257/529 |
| 5,438,544 | A | 8/1995 | Makino | 365/185 |
| 5,442,226 | A | 8/1995 | Maeda et al. | 257/557 |
| 5,449,941 | A | 9/1995 | Yamazaki et al. | 257/411 |
| 5,454,022 | A | 9/1995 | Lee et al. | 378/98.8 |
| 5,454,928 | A | 10/1995 | Rogers et al. | 205/125 |
| 5,458,702 | A | 10/1995 | Ono et al. | 148/432 |
| 5,465,249 | A | 11/1995 | Cooper et al. | 365/149 |
| 5,467,306 | A | 11/1995 | Kaya et al. | 365/185.2 |
| 5,470,801 | A | 11/1995 | Kapoor et al. | 437/238 |
| 5,471,515 | A | 11/1995 | Fossum et al. | 377/60 |
| 5,477,485 | A | 12/1995 | Bergemont et al. | 365/185.24 |
| 5,493,140 | A | 2/1996 | Iguchi | 257/316 |
| 5,501,645 | A | 3/1996 | Taniguchi et al. | 477/130 |
| 5,508,543 | A | 4/1996 | Hartstein et al. | 257/314 |
| 5,510,645 | A | 4/1996 | Fitch et al. | 257/522 |
| 5,512,785 | A | 4/1996 | Haver et al. | 257/758 |
| 5,516,724 | A | 5/1996 | Ast et al. | 437/160 |
| 5,516,745 | A | 5/1996 | Friesen et al. | 502/401 |
| 5,530,581 | A | 6/1996 | Cogan | 359/265 |
| 5,539,227 | A | 7/1996 | Nakano | 257/276 |
| 5,541,124 | A | 7/1996 | Miwa et al. | 437/31 |
| 5,563,448 | A | 10/1996 | Lee et al. | 257/742 |
| 5,580,380 | A | 12/1996 | Liu et al. | 117/86 |
| 5,587,326 | A | 12/1996 | Takemura | 437/31 |
| 5,587,596 | A | 12/1996 | Chi et al. | 257/223 |
| 5,593,921 | A | 1/1997 | Chen et al. | 437/195 |
| 5,608,243 | A | 3/1997 | Chi et al. | 257/249 |
| 5,616,948 | A | * 4/1997 | Pfiester | 257/412 |
| 5,625,210 | A | 4/1997 | Lee et al. | 257/292 |
| 5,639,979 | A | 6/1997 | Chen et al. | 84/615 |
| 5,643,806 | A | 7/1997 | Miwa et al. | 437/31 |
| 5,648,280 | A | 7/1997 | Kato | 437/31 |
| 5,670,790 | A | 9/1997 | Katoh et al. | 257/14 |
| 5,698,890 | A | 12/1997 | Sato | 257/592 |
| 5,705,425 | A | 1/1998 | Miura et al. | 437/182 |
| 5,710,454 | A | * 1/1998 | Wu | 257/413 |
| 5,723,378 | A | 3/1998 | Sato | 438/309 |
| 5,723,893 | A | * 3/1998 | Yu et al. | 257/413 |
| 5,731,240 | A | 3/1998 | Kataoka | 438/364 |
| 5,745,990 | A | 5/1998 | Lee et al. | 29/852 |
| 5,753,967 | A | 5/1998 | Lin | 257/635 |
| 5,757,072 | A | 5/1998 | Gorowitz et al. | 257/522 |
| 5,766,999 | A | 6/1998 | Sato | 438/309 |
| 5,796,151 | A | * 8/1998 | Hsu et al. | 257/410 |
| 5,796,166 | A | * 8/1998 | Agnello et al. | 257/751 |
| 5,798,544 | A | 8/1998 | Ohya et al. | 257/296 |
| 5,798,559 | A | 8/1998 | Bothra et al. | 257/522 |
| 5,801,444 | A | 9/1998 | Aboelfotah et al. | 257/742 |
| 5,835,141 | A | 11/1998 | Ackland et al. | 348/308 |
| 5,841,159 | A | 11/1998 | Lee et al. | 257/291 |
| 5,846,871 | A | * 12/1998 | Lee et al. | 438/592 |
| 5,847,439 | A | 12/1998 | Reinberg | 257/522 |
| 5,854,100 | A | 12/1998 | Chi | 438/202 |
| 5,861,340 | A | 1/1999 | Bai et al. | 438/592 |
| 5,880,508 | A | * 3/1999 | Wu | 257/411 |
| 5,891,797 | A | 4/1999 | Farrar | 438/619 |
| 5,920,121 | A | 7/1999 | Forbes et al. | 257/742 |
| 5,925,918 | A | * 7/1999 | Wu et al. | 257/413 |
| 5,925,933 | A | 7/1999 | Colgan et al. | 257/762 |
| 5,930,596 | A | 7/1999 | Klose et al. | 438/98 |
| 5,930,668 | A | 7/1999 | Gardner | 438/624 |
| 5,939,758 | A | * 8/1999 | Arima | 257/377 |
| 5,942,799 | A | * 8/1999 | Danek et al. | 257/751 |
| 5,955,761 | A | * 9/1999 | Yoshitomi et al. | 257/336 |
| 5,960,313 | A | 9/1999 | Jun | 438/624 |
| 5,989,718 | A | 11/1999 | Smith et al. | 428/446 |
| 6,025,261 | A | 2/2000 | Farrar et al. | 438/619 |
| 6,069,389 | A | 5/2000 | Sasaki | 257/370 |
| 6,080,646 | A | 6/2000 | Wang | 438/585 |
| 6,150,252 | A | 11/2000 | Hsu et al. | 438/597 |
| 6,157,082 | A | 12/2000 | Merchant et al. | 257/758 |
| 6,180,509 | B1 | 1/2001 | Huang et al. | 438/624 |
| 6,211,562 | B1 | 4/2001 | Forbes et al. | 257/581 |
| 6,265,602 | B1 | 7/2001 | Voit et al. | 558/459 |
| 6,271,551 | B1 | 8/2001 | Schmitz et al. | 257/288 |

FOREIGN PATENT DOCUMENTS

| | | | | |
|---|---|---|---|---|
| JP | 63-299268 | 12/1988 | | H01L/27/14 |
| JP | 1-135184 | 5/1989 | | H04N/5/335 |

| | | | |
|---|---|---|---|
| JP | 1-243462 | 7/1989 | ............ H01L/27/14 |
| JP | 3-161964 | 7/1991 | ............ H01L/27/06 |
| JP | 3-222367 | 10/1991 | ......... H01L/29/784 |
| JP | 6-224431 | 8/1994 | ......... H01L/29/784 |
| JP | 6-302828 | 10/1994 | ......... H01L/29/788 |
| JP | 8-255878 | 10/1996 | ............ H01L/27/10 |

OTHER PUBLICATIONS

Campbell, S.A., *The Science and Engineering of Microelectronic Fabrication*, Oxford University Press, 476, (1996).

Cherkasov, Y.A., et al., "Optical information media based on an amorphous photoconductor with high avalanche amplification—the amorphous analog of trigonal selenium", *Journal of Optical Technology*, vol. 64, No. 7, 627–32, (Jul. 7, 1997).

Edelberg, E., et al., "Visible Luminescence from Nanocrystalline silicon films produced by plasma enhanced chemical vapor deposition", *Appl. Phys. Lett.*, 68, 1415–1417, (1996).

Hybertsen, M.S., "Absorption and Emission of Light in Nanoscale Silicon Structures", *Phys. Rev. Lett.*, 72, 1514–1517, (1994).

Kato, M., et al., "Read–Disturb Degradation Mechanism due to Electron Trapping in the Tunnel Oxide for Low–voltage Flash Memories", *IEEE Electron Device Meeting*, 45–48, (1994).

Shuto, S., et al., "Read Disturb Degradation Mechanism for Source Erase Flash Memories", 1996 Symposium on VLSI Technology, Digest of Technical Papers, Honolulu, HI, 242–43, (1996).

Tsu, R., et al., "Tunneling in Nanoscale Silicon Particles Embedded in an SiO/sub/2 Matrix", Abstract, IEEE Device Research Conference, 178–179, (1996).

Ye, Q., et al., "Resonant Tunneling via Microcrystalline–silicon quantum confinement", *Physical Rev. B*, 44, 1806–1811, (1991).

Zhao, X., et al., "Nanocrystalline Si: a material constructed by Si quantum dots", 1st Int. Conf. on Low Dimensional Structures and Devices, Singapore, 466–471, (1995).

U.S. patent application Ser. No. 09/030,430, filed Feb. 25, 1998, "Methods and Structures for Metal Interconnections in integrated circuits".

U.S. patent application Ser. No. 09/030,113, filed Feb. 25, 1998, "Methods and Structures for Silver Interconnections in integrated circuits".

U.S. patent application Ser. No. 09/030,188, filed Feb. 25, 1998, "Methods and Structures for Gold Interconnections in integrated circuits".

U.S. patent application Ser. No. 09/188,970, filed Nov. 10, 1998, "Methods and Structures for Gold Interconnections in integrated circuits".

Boeringer, D.W., et al., "Avalanche amplification of multiple resonant tunneling through parallel silicon microcrystallites", *Physical Rev. B*, 51, 13337–13343, (1995).

Chor, E.F., et al., "Emitter Resistance of Arsenic– and Phosphorus–Doped Polysilicon Emitter Transistors", *IEEE Trans. on Electron Devices*, vol. Ed–6, No. 10, 516–18, (1985).

Moller, H., et al., "In–situ p– and n–Doping of Low Temperature Grown Beta–SiC Epitaxial Layers on Silicon", Proc. of International Conference on Silicon Carbide and Related Materials, IOP Publishing, UK, 497–500, (1996).

Shafi, Z.A., et al., "Poly–Crystalline Silicon–Carbide (SiC) Emitter Bipolar Transistors", *IEEE Bipolar Circuits and Technology Meeting*, Minneapolis, MN, 67–70, (1991).

Uchino, T., et al., "Very High Speed Silicon Bipolar Transistors with In–Situ Doped Polysilicon Emitter and Rapid Vapor–Phase Doping Base", *IEEE Trans. on Electron Devices*, vol. 42, No. 1, 406–12, (1995).

Villars, P., et al., *Handbook of Ternary Alloy Phase Diagrams*, vol. 3, ASM International, 2893–99.

Walczyk, F., et al., "Tailoring Interfacial Oxide for Polysilicon Bit–Cell Contacts and Emitters with In Situ Vapor HF Interface Cleaning and Polysilicon Deposition in a 4Mbit BiCMOS Fast Static RAM", *Proc. IEEE Bipolar Circuits and Technology Meeting*, Minneapolis, MN, 84–87, (1992).

Yamaguchi, Y., et al., "Properties of Heteroepitaxial 3C–SiC Films Grown by LPCVD", Digest of Tech. Papers: 8th Int. Conf. on Solid–State Sensors and Actuators and Eurosensors IX, vol. 2, Stockholm, Sweden, 190–193, (Jun. 1995).

Yamanashi, H., et al., "Deposition of Silicon Compound Thin Films in DC Discharge Plasma Using Hydrogen–Hexamethyldisilane Gas Mixture", Proc.: Int. Symp. on Surfaces and Thin Films of Electronic Materials. Bull. of the Res. Institute of Electronics, Shizuoka University, 30, 95–98, (1995).

Akasaki, I., et al., "Effects of A1N Buffer Layer on Crystallographic Structure and on Electrical and Optical Properties of GaN and Ga(1–x)Al(x)N [0< x (< or =) 0.4] Films Grown on Sapphire Substrate by MOVPE", *J. Crystal Growth*, 98, 209–219, (1989).

Alok, D., et al., "Electrical Properties of Thermal Oxide Grown on N–type 6H–Silicon Carbide", *Applied Physics Letters*, 64, 2845–2846, (May 23, 1994).

Andrieux, M., et al., "Interface and Adhesion of PACVD SiC Based Films on Metals", *Supp. Le Vide: science, technique et applicaitons*, 279, 212–214, (1996).

Bachmann, P., et al., "Influence on Surface Modifications on the Electronic Properties of CVD Diamond Films", *Diamond and Related Materials*, 5, 1378–1383, (1996).

Baglee, D., "Characteristics & Reliability of 100 Angstrom Oxides", *IEEE 22nd Annual Proc.: Reliability Physics*, Las Vegas, 152–155, (Apr. 3–5, 1984).

Beheim, G., et al., "Magnetron Plasma Etching of SiC for Microstructures", *Proc. SPIE—Integrated Optics and Microstructures III*, San Jose, CA, 82–86, (Jan. 29, 1996).

Bengtsson, S., et al., "Applications of Aluminum Nitride Films Deposited by Reactive Sputtering to Silicon–On–Insulator Materials", *Japanese J. Applied Physics*, 35, 4175–4181, (1996).

Benjamin, M., et al., "UV Photoemission Study of Heteroepitaxial AlGaN Films Grown on 6H–SiC", *Applied Surface Science*, 104/105, 455–460, (1996).

Berezhnoi, A., *Silicon and its Binary Systems*, Consultants Bureau, New York, 84, (1960).

Bermudez, V., et al., "The Growth and Properties of Al and AlN Films on GaN(0001)–(1x1)", *J. Applied Physics*, 79, 110–119, (Jan. 1996).

Casey, H., et al., "Low Interface Trap Density for Remote Plasma Deposited SiO2 on n–type GaN", *Applied Phys. Lett.*, 68, 1850–1852, (Mar. 1996).

Chang, C., et al., "Novel Passivation Dielectrics—The Boron—or Phosphorous–Doped Hydrogenated Amorphous Silicon Carbide Films", *Journal of the Electrochemical Society*, 132, 418–422, (Feb. 1985).

Choi, J., et al., "Effect of Deposition Conditions and Pretreatments on the Microstructure of MPECVD Diamond Thin Films", *Materials Chemistry and Physics*, 45, 176–179, (1996).

Clarke, G., et al., "The Infrared Properties of Magnetron–Sputtered Diamond–Like Thin Films", *Thin Solid Films*, 280, 130–135, (1996).

Compagnini, G., et al., "Spectroscopic Characterization of Annealed Si(1–x)C(x) Films", *J. Materials Res.*, 11, 2269–2273, (Sep. 1996).

Dartnell, N., et al., "Reactive Ion Etching of Silicon Carbide (Si(x)C(1–x))", *Vacuum*, 46, 349–355, (1995).

Demichelis, F., et al., "Influence of Doping on the Structural and Optoelectronic Properties of Amorphous and Microcrystalline Silicon Carbide", *Journal of Applied Physics*, 72, 1327–1333, (Aug. 15, 1992).

Demichelis, F., et al., "Physical Properties of Undoped and Doped Microcrystalline SiC:H Deposited By PECVD", Materials Research Society Symposium Proceedings, 219, Anaheim, CA, 413–418, (Apr. 30–May 3, 1991).

Dipert, B., et al., "Flash Memory Goes Mainstream", *IEEE Spectrum*, 30, 48–52, (1993).

Fissel, A., et al., "Epitaxial Growth of SiC Thin Films on Si–stabilized alpha–SiC (0001) at Low Temperatures by Solid–source Molecular Beam Epitaxy", *Journal of Crystal Growth*, 154, 72–80, (1995).

Friedrichs, P., et al., "Interface Properties of Metal–Oxide–Semiconductor Structures on N–Type 6H and 4H–SiC", *J. Applied Physics*, 79, 7814–7819, (May 15, 1996).

Fujii, T., et al., "Bonding Structures in Highly Photoconductive a–SiC:H Films Deposited by Hybrid–Plasma Chemical Vapor Deposition", *Journal of Non–Crystalline Solids*, 198–200, 577–581, (1996).

Fukuda, Y., et al., "A New Fusible–Type Programmable Element Composed of Aluminum and Polysilicon", *IEEE Trans. on Electron Devices*, ED–33, 250–253, (Feb., 1986).

Goetzberger, A., et al., *Applied Solid State Science: Advances in Materials and Device Research*, R. Wolfe, ed., Academic Press, New York, Including p. 233, (1969).

Graul, J., et al., "Growth Mechanism of Polycrystalline beta–SiC Layers on Silicon Substrate", *Applied Phys. Lett.*, 21, 67–69, (Jul. 1972).

Hamakawa, Y., et al., "Optoelectronics and Photovoltaic Applications of Microcrystalline SiC", Materials Research Society Symposium Proceedings, 164, Boston, MA, 291–301, (Nov. 29–Dec. 1, 1989).

Hanna, J., et al., "Early Stage of Polycrystalline Growth of Ge and SiGe by Reactive Thermal CVD from GeF(4) and Si(2)H(6)", Materials Res. Soc. Symp. Proc., 358, Boston, MA, 877–881, (Nov./Dec., 1994).

Hansen, P., *Constitution of Binary Alloys*, McGraw–Hill, New York, 103, (1958).

He, Z., et al., "Ion–beam–assisted Deposition of Si–carbide Films", *Thin Solid Films*, 260, 32–37, (1995).

Hiraki, A., et al., "Formation of Silicon Oxide over Gold Layers on Silicon Substrates", *J. Applied Physics*, 43, 3643–3649, (Sep., 1972).

Hiraki, A., et al., "Low–Temperature Migration of Silicon in Metal Films on Silicon Substrates Studiedby Backscattering Techniques", *J. Vacuum Science and Tech.*, 9, 155–158, (Jan./Feb., 1972).

Horie, H., et al., "Novel High Aspect Ration Aluminum Plug for Logic/DRAM LSI's Using Polysilicon–Aluminum Substitute", *Technical Digest: IEEE Int. Electron Devices Meeting*, San Francisco, CA, 946–948, (1996).

Hu, G., "Will Flash Memory Replace Hard Disk Drive?", *IEEE Electron Devices Meeting, Session 24*, (Dec. 13, 1994).

Hurley, P., et al., "Low Temperature Plasma Oxidation of Polycrystalline Silicon", Proc. 7th European Conf. on Insulating Films on Semiconductors: Contributed Papers, Section 5, IOP Publishing Ltd., 235–238, (1991).

Hwang, J., et al., "High Mobility beta–SiC Epilayer Prepared by Low–pressure Rapid Thermal Chemical Vapor Deposition on a (100) Silicon Substrate", *Thin Solid Films*, 272, 4–6, (1996).

Hwang, J., et al., "Novel Polysilicon/TiN Stacked–Gate Structure for Fully–Depleted SOI/CMOS", *Technical Digest: Int. Electron Devices Meeting*, San Francisco, CA, 345–348, (Dec. 1992).

Jou S., et al., "Electron Emission Characterization of Diamond Thin Films Grown from a Solid Carbon Source", *Thin Solid Films*, 280, 256–261, (1996).

King, T., et al., "Deposition and Properties of Low–Pressure Chemical–Vapor Deposited Polycrystalline Silicon–Germanium Films", *J. Electrochemical Society*, 141, 2235–2241, (Aug. 1994).

Kothandaraman, M., et al., "Reactive Ion Etching of Trenches in 6H–SiC", *J. Electronic Materials*, 25, 865–878, (1996).

Kumbhar, A., et al., "Growth of Clean Amorphous Silicon–Carbon Alloy Films by Hot–Filament Assisted Chemical Vapor Deposition Technique", *Applied Phys. Lett*, 66, 1741–1743, (Apr. 1995).

Lakshmi, E., et al., "Interface–State Characteristics of GaN/GaAs MIS Capacitors", *Solid–State Electronics*, 25, 811–815, (1982).

Lanois, F., et al., "Angle Etch Control for Silicon Carbide Power Devices", *Applied Phys. Lett.*, 69, 236–238, (Jul. 1996).

Lau, S., et al., "Optoelectronic Properties of Highly Conductive Microcrystalline SiC Produced by Laser Crystallization of Amorphous SiC", *J. of Non–Crystalline Solids*, 198–200, 907–910, (1996).

Lee, D.H., et al., "Gate Oxide Integrity (GOI) of MOS transistors with W/TiN stacked gate", 1996 Symposium on VLSI Technology Digest of Technical Papers, 208–209, (1996).

Leggieri, G., et al., "Laser Ablation Deposition of Silicon Carbide Films", *Applied Surface Science*, 96–98, 866–869, (1996).

Lei, T., et al., "Epitaxial Growth and Characterization of Zinc–Blende Gallium Nitride on (001) Silicon", *J. Appl. Phys.*, 71, 4933–4943, (May 1992).

Li, C., et al., "Low Temperature Heteroepitaxial Growth of Si(1–x)Ge(x)–on–Si by Photo–Enhanced Ultra High Vacuum Chemical Vapor Deposition Using Si(2)H(6) and Ge(2)H(6)", *J. Electronic Materials*, 24, 875–884, (Jul. 1995).

Li, P., et al., "Formation of Stoichiometric SiGe Oxide by Electron Cyclotron Resonance Plasma", *Appl. Phys. Lett*, 60, 3265–3267, (Jun. 1992).

Liu, J., et al., "Formation of SiC Films on Silicon Field Emitters", Materials Res. Soc. Symp. Proc., 311, San Francisco, CA, (Apr. 13–15, 1993).

Liu, J., et al., "Modification of Si Field Emitter Surfaces by Chemical Conversion to SiC", *J. Vac. Sci. Technology*, B 12, 717–721, (1994).

Luo, J., et al., "Localized Epitaxial Growth of Hexagonal and Cubic SiC Films on Si by Vacuum Annealing", *Applied Phys. Lett.*, 69, 916–918, (Aug. 1996).

Lyman, T.e., "Metallography, Structure and Phase Diagrams", *Metals Handbook*, 8, American Society for Metals; Metals Park, Ohio, 253, 256, 260, 263,, (1989).

Martins, R., et al., "Transport Properties of Doped Silicon Oxycarbide Microcrystalline Films Produced by Spatial Separation Techniques", *Solar Energy Materials and Solar Cells*, 41–42, 493–517, (1996).

Martins, R., et al., "Wide Band Gap Microcrystalline Silicon Thin Films", *Diffusion and Defect Data: Solid State Phenomena*, 44–46, Part 1, Scitec Publications, 299–346, (1995).

Maury, F., et al., "Chemical Vapor Co–Deposition of C and SiC at Moderate Temperature for the Synthesis of Compositionally Modulated Si(x)C(1–x) Ceramic Layers", *Surface and Coatings Technology*, 76–77, 119–125, (1995).

McLane, G., et al., "High Etch Rates of SiC in Magnetron Enhanced SF(6) Plasmas", *Applied Phys. Lett.*, 68, 3755–3757, (Jun. 1996).

Moffatt, W., *The Handbook of Binary Phase Diagrams*, General Electric Company, pub., vol. 1, 3/84, (1978).

Mogab, C., et al., "Conversion of Si to Epitaxial SiC by Reaction with C(2)H(2)", *J. Applied Physics*, 45, 1075–1084, (Mar. 1974).

Mohajerzadeh, S., et al., "A Low Energy Ion Beam Assisted Deposition Technique for Realizing iso–type SiGe/Si hetero–interface diodes", *Thin Solid Films*, 283, 182–187, (1996).

Mohajerzadeh, S., et al., "A Low–Temperature Ion Vapor Depostion Technique for Silicon and Silicon–Germanium Epitaxy", *Canadian J. Physics*, 74, S69–S73, (1996).

Mohri, M., et al., "Effect of SiF(4)/SiH(4)/H(2) Flow Rates on Film Properties of Low–Temperature Polycrystalline Silicon Films Prepared by Plasma Enhanced Chemical Vapor Deposition", *IEIECE Transactions on Electronics*, E77–C, 1677–1684, (Oct. 1994).

Molnar, R., et al., "Growth of Gallium Nitride by Electron–Cyclotron Resonance Plasma–Assisted Molecular–Beam Epitaxy: The Role of Charged Species", *J. Appl. Phys.*, 76, 4587–4595, (1994).

Mukhopadhyay, M., et al., "Properties of SiGe Oxides Grown in a Microwave Oxygen Plasma", *J. Applied Physics*, 78, 6135–6140, (Nov. 1995).

Muller, K., et al., "Trench Storage Node Technology for Gigabit DRAM Generations", *Digest IEEE Int. Electron Devices Meeting*, San Francisco, CA, 594–597, (Dec. 1996).

Namanich, P., et al., "Diamond Negative Electron Affinity Surfaces, Structures and Devices", Proc.: Third International Conference on Applications of Diamond Films and Related Materials, 1, Gaithersburg, MD, 17–24, (1995).

Nemanich, R., et al., "Negative Electron Affinity Surfaces of Aluminum Nitride and Diamond", *Diamond and Related Materials*, 5, 790–796, (1996).

Ouyang, M., et al., "Deposition of Diamond–Like Carbon Films via Excimer Laser Ablation of Polybutadiene", *Materials Science and Engineering*, B39, 228–231, (1996).

Pankove, J., "Photoelectric Emission", In: *Optical Processes in Semiconductors*, Dover Publications Inc., New York, 287–301, (1971).

Pankove, J., et al., "Photoemission from GaN", *Applied Phys. Lett.*, 25, 53–55, (1974).

Papadas, C., et al., "Modeling of the Intrinsic Retention Charcteristics of FLOTOX EEPROM Cells Under Elevated Temperature Conditions", *IEEE Transaction on Electron Devices*, 42, 678–682, (Apr. 1995).

Patuwathavithane, O., et al., "Oxidation Studies for 6H–SiC", Proc.: 4th Int. Conf. on Amorphous and Crystalline Silicon Carbide IV, Santa Clara, CA, 163–169, (Oct. 9–11, 1991).

Pereyra, I., et al., "Wide Gap a–Si(1–x)C(x): H Thin Films Obtained Under Starving Plasma Deposition Conditions", *J. Non–Crystalline Solids*, 201, 110–118, (1996).

Pollack, S., "Electron Transport Through Insulating Thin Films", *Appl. Solid–State Science*, 1, 345–355, (1969).

Predel, B., et al., "Die Zustandsdiagramme Silber–Germanium–Silizium und Gold–Germanium–Silizium", *J. Less–Common Metals*, 44, 39–49, (Jan. 1976).

Prendergast, J., "FLASH or DRAM: Memory Choice for the Future", *IEEE Electron Device Meeting, Session 25*, Phoenix, AZ, (1995).

Rahman, M., et al., "Preparation and Electrical Properties of An Amorphous SiC/ Crystalline Si p(+)n Heterostructure", *Japanese J. Applied Physics*, 23, 515–524, (May 1984).

Renlund, G., et al., "Silicon Oxycarbide Glasses: Part I. Preparation and Chemistry", *Journal of Materials Research*, 6, 2716–2722, (Dec. 1991).

Renlund, G., et al., "Silicon Oxycarbide Glasses: Part II. Structure and Properties", *Journal of Materials Research*, 6, 2723–2734, (Dec. 1991).

Schadel, H., et al., "Activity of Liquid Silver–Silicon Alloys", *Trans. American Institute of Mining and Metallurgical Engineers*, 188, 1282–1283, (Oct. 1950).

Schmidt, I., et al., "Low Temperature Diamond Growth Using Fluorinated Hydrocarbons", *Diamond and Related Materials*, 5, 1318–1322, (1996).

Schoenfeld, O., et al., "Formation of Si Quantum dots in Nanocrystalline silicon", Proc. 7th Int. Conf. on Modulated Semiconductor Structures, Madrid, 605–608, (1995).

Serre, C., et al., "Ion–Beam Synthesis of Amorphous SiC Films: Structural Analysis and Recrystallization", *J. Appl. Phys.*, 79, 6907–6913, (May 1996).

Sim, S., et al., "A New Planar Stacked Technology (PST) for Scaled and Embedded DRAMs", *Digest IEEE Int. Electron Devices Meeting*, San Francisco, CA, 504–507, (Dec. 1996).

Suzaki, Y., et al., "Quantum Size Effects of a–Si(:H)/ a–SiC(:H) Multilayer Films Prepared by rf Sputtering", *Abstracts of Papers Published in the Int. J. Japenese Soc. for Precision Engineering*, 28, Abstract of Paper in vol. 60, 182, (Jun. 1994).

Svirkova, N., et al., "Deposition Conditions and Density–of–States Spectrum of a–Si(1–x)C(x) :H Films Obtained by Sputtering", *Semiconductors*, 28, 1164–1169, (Dec. 1994).

Sze, S., *Physics of Semiconductors*, 2nd Edition., John Wiley & Sons, Pub., New York, ISBN 0471056618, (1981).

Tarui, Y., "Flash Memory Features Simple Structure, Superior Integration", *JEE*, 30, 84–87, (Sep. 1993).

Tenhover, M., et al., "DC–Magnetron Sputtered Silicon Carbide", Materials Res. Soc. Symp. Proc., 356, Boston, MA, 227–232, (Nov. 28–Dec. 2, 1994).

Thomas, J., et al., "Plasma Etching and Surface Analysis of a–SiC :H Films Deposited by Low Temperature Plasma Enhanced Chemical Vapor Deposition", Materials Res. Soc. Symp. Proc., 334, Boston, MA, 445–450, (Nov. 29–Dec. 2, 1993).

Tiwari, S., et al., "A silicon nanocrystal based memory", *Appl. Physics Lett.*, 68, 1377–1379, (1996).

Tiwari, S., et al., "Volatile and Non–Volatile Memories in Silicon with Nano–Crystal Storage", *Int'l Electron Devices Meeting: Technical Digest*, Washington, DC, 521–524, (Dec. 1995).

Tucker, C., et al., "Ion–beam–assisted Deposition of Non-hydrogenated a–Si:C Films", *Can. J. Physics*, 74, 97–101, (1996).

Ushiku, Y., et al., "Planarized Silver Interconnect Technology with a Ti Self–Passivation Technique for Deep Sub–Micron ULSIs", 1993 Symp. on VLSI Technology: Digest of Technical Papers, 121–122, (1993).

van der Weide, J., et al., "Negative–electron–affinity Effects on the Diamond (100) Surface", *Physical Review B [Condensed Matter]*, 50, 5803–5806, (Aug. 15, 1994).

Vodakov, Y., et al., "Diffusion and Solubility of Impurities in Silicon Carbide", In: *Silicon Carbide*, R.C. Marshall, et al., eds., Univ. of South Carolina Press, 508–519, (1973).

Wahab, Q., et al., "3C–SiC / Si / 3C–SiC Epitaxial Trilayer Films Deposited on Si (111) Substrates by Reactive Magnetron Sputtering", *J. Materials Res.*, 10, 1349–1351, (Jun. 1995).

Watanabe, A., et al., "SiC Thin Film Preparation by ArF Excimer Laser Chemical Vapor Deposition. Part 1: Rate of Photolysis of Alkylsilanes by ArF Excimer Lasers and their Decomposition Products", *Thin Solid Films*, 274, 70–75, (1996).

Wolter, S., et al., "Textured Growth of Diamond on Silicon via in situ Carburization and Bias–Enhanced Nucleation", *Appl. Phys. Lett.*, 62, 1215–1217, (Mar. 1993).

Wu, K., et al., "The Growth and Characterization of Silicon/Silicon Carbide Heteroepitaxial Films on Silicon Substrates by Rapid Thermal Chemical Vapor Deposition", *Japanese J. Appl. Phys.*, 35, 3836–3840, (1996).

Wu, S., et al., "Suppression of the Boron Penetration Induced Si/SiO2 Interface Degradation by Using a Stacked–Amorphous–Silicon Film as the Gate Structure for pMOSFET", *IEEE Electron Device Letters*, 15, 160–162, (May 1994).

Yamaguchi, Y., et al., "Properties of Heteroepitaxial 3C–SiC Films Grown by LPCVD", Digest of Tech. Papers: 8th Int. Conf. on Solid–State Sensors and Actuators and Eurosensors IX, vol. 2, Stockholm, Sweden, 190–193, (Jun. 1995).

Yamanashi, H., et al., "Deposition of Silicon Compound Thin Films in DC Discharge Plasma Using Hydrogen–Hexamethyldisilane Gas Mixture", Proc.: Int. Symp. on Surfaces and Thin Films of Electronic Materials. Bull. of the Res. Institute of Electronics, Shizuoka University, 30, 95–98, (1995).

Yee, A., et al., "The Effect of Nitrogen on Pulsed Laser Deposition of Amorphous Silicon Carbide Films: Properties and Structure", *J. Materials Research*, 12, 1979–1986, (1996).

Yoder, M., "Wide Bandgap Semiconductor Materials and Devices", *IEEE Transactions on Electron Devices*, 43, 1633–1636, (Oct. 1996).

"CMOS Active Pixel Image Sensor" by Mendis et al., *IEEE Transactions On Electron Devices*, vol. 41, No. 3, Mar. 1994, pp. 452–453.

"The Pinned Photodiode For An Interline–Transfer CCD Image Sensor" by B. C. Burkey et al., *IEDM 84*, 1984, pp. 28–31.

"A ¼ Inch 330k Square Pixel Progressive Scan CMOS Active Pixel Image Sensor", by Eiji Oba et al., 1997 IEEE International Solid–State Circuits Conference, pp. 180–189 and pp. 452–454.

"An 800K–Pixel Color CMOS Sensor For Consumer Still Cameras", by J.E.D. Hurwitz et al., *VLSI Vision Ltd.*, Aviation House, 31 Pinkhill, Edinburgh.

"A 250,000–Pixel Image Sensor With FET Amplification at Each Pixel for High–Speed Television Cameras", by Fumihiko Andoh et al., Feb. 16, 1990, 1990 IEEE International Solid–State Circuit Conference, pp. 212–213 and p. 298.

A Small Pixel CMD Image Sensor, by Masanori Ogata et al., *IEEE Transactions on Electron Devices*, vol. 38, No. 5, May 1991, pp. 1005–1010.

"Technology and Device Scaling Considerations For CMOS Imagers", by Hon–Sum Wong, *IEEE Transactions On Electron Devices*, vol. 43, No. 12, Dec. 1996, pp. 2131–2142.

"Active Pixel Sensors: Are CCD's Dinosaurs?", by Eric R. Fossum, *SPIE*, vol. 1900, pp. 2–14.

"128x128 CMOS Photodiode–Type Active Pixel Sensor With On–Chip Timing, Control and Signal Chain Electronics", by R. H. Nixon et al., Proceedings of the SPIE, vol. 2415, "Charge–Coupled Devices and Solid–State Optical Sensors V", paper 34 (1995), pp. 1–7.

"The Operation Mechanism of a Charge Modulation Device (CMD) Image Sensor", by Kazuya Matsumoto et al., *IEEE Transactions On Electron Devices*, vol. 38, No. 5, 1991, pp. 989–998.

Analysis of Operational Speed and Scaling Down the Pixel Size of a Charge Modulation Device (CMD) Image Sensor, by Kazuya Matsumoto et al., *IEEE Transactions on Electron Devices*, vol. 38, No. 5, May 1991, pp. 999–1004.

"A Small Pixel CMD Image Sensor", by Masanori Ogata et al., *IEEE Transactions On Electron Devices*, vol. 38, No. 5, May 1991, pp. 1005–1010.

"BCMD—An Improved Photosite Structure got High–Density Image Sensors", by Jaroslav Hynecek, *IEEE Transactions On Electron Devices*, vol. 38, No. 5, May 1991, pp. 1011–1020.

"A 250 k–Pixel SIT Image Sensor Operating in its High–Sensitivity Mode", by Toyokazu Mizoguchi et al., *IEEE Transactions On Electron Devices*, vol. 38, No. 5, May 1991, pp. 1021–1027.

"Design of Bipolar Imaging Device (BASIS)", by Yoshio Nakamura et al., *IEEE Transactions On Electron Devices*, vol. 38, No. 5, May 1991, pp. 1028–1036.

Reduction of Fixed–Pattern Noise of BASIS Due to Low Kinetic Energy Reactive Ion and Native–Oxide–Free Processing, by Mamoru Miyawaki et al., *IEEE Transactions On Electron Devices*, vol. 38, No. 5, May 1991, pp. 1037–1043.

"A High–Sensitivity MOS Photo–Transistor for Area Image Sensor", by Yoshiyuki Matsunaga et al., *IEEE Transactions On Electron Devices*, vol. 38, No. 5, May 1991, pp. 1044–1047.

"Amplifying Solid–State Image Pickup Element AMI (Amplified MOS Intelligent Imager)", by Fumihiko Ando et al., *Special Edition: Solid–State Image Pickup Technology*, vol. 41, No. 11, 1987, pp. 1075–1082 (translated pp. 1–33).

"An Active Pixel Sensor Fabricated Using CMOS/CCD Processing Technology", by Paul P. K. Lee et al., *Presented at the 1995 IEEE Workshop on Charged–Coupled Devices and Advanced Image Sensors*, Apr. 20–22, 1995, Dana Point, CA, pp. 1–5.

\* cited by examiner

HIGHLY CONDUCTIVE COMPOSITE POLYSILICON GATE FOR CMOS INTEGRATED CIRCUITS

BACKGROUND OF THE INVENTION

The present invention concerns fabrication methods and structures for integrated circuits, particularly methods and structures for field-effect transistors.

Integrated circuits, the key components in thousands of electronic and computer products, are interconnected networks of electrical components fabricated on a common foundation, or substrate. Fabricators typically use various techniques, such as layering, doping, masking, and etching, to build thousands and even millions of microscopic resistors, transistors, and other electrical components on a silicon substrate, known as a wafer. The components are then "wired," or interconnected, together to define a specific electric circuit, such as a computer memory or microprocessor.

Many integrated circuits include a common type of transistor known as a metal-oxide-semiconductor, field-effect transistor, or "mosfet" for short. A mosfet has four electrodes, or contacts—specifically, a gate, source, drain, and body—which connect to other transistors or components to form a circuit. In digital integrated circuits, such as logic circuits, memories, and microprocessors which operate with electrical signals representing ones and zeroes, each mosfet behaves primarily as a switch, with its gate serving to open and close a channel connecting its source and drain. Closing the switch requires applying a certain threshold voltage to the gate, and opening it requires either decreasing or increasing the gate voltage relative the threshold voltage, depending on whether the channel is made of negatively or positively doped semiconductive material.

One class of mosfet problems concerns the structure and composition of its gate. The gates of early mosfets were formed from a two-layer structure comprising a top aluminum layer and an underlying insulative layer, which separates and thus isolates the aluminum from its underlying semiconductive channel. This structure was a problem not only because the aluminum diffused through the underlying insulative layer and destroyed isolation between the gate and underlying channel, but also because the low-melting temperature of aluminum conflicted with high-temperature baking, or annealing, steps necessary to properly form a drain and source in alignment with the gate. Thus, for better reliability and superior drains and sources, contemporary mosfets have gates made, not from aluminum nor any other metal, but from polycrystalline silicon, sometimes called "polysilicon" or simply, "poly."

Polysilicon, which has a multi-crystalline structure instead of the single-crystalline structure of silicon wafers, can be altered through doping, a process of adding impurities, to act as a conductor, similar to aluminum but unfortunately with about ten-times more electrical resistance. This higher resistance can be ameliorated some by silicidation, a process of coating and reacting polysilicon with a salicide-forming refractory metal. But, the higher resistance of even the salicided polysilicon gates combines with inherent integrated-circuit capacitances to cause significant delays in conducting signals from one circuit point to another, ultimately limiting how fast integrated circuits operate.

In response, several efforts have been made to form gates from materials less-resistive than polysilicon or polysilicon salicides. For example, D. H. Lee and coworkers have proposed making gates from tungsten (W) and titanium nitride (TiN). (See "Gate Oxide Integrity (GOI) of MOS Transistors with W/TiN Stacked Gate," Symposium on VLSI Technology, Honolulu, pp. 208–209, 1996.) In addition, a team led by J. M. Hwang has proposed a gate consisting of stacked layers of polysilicon and titanium nitride. (See "Novel Polysilicon/TiN Stacked-Gate Structure for Fully-Depleted SOI/CMOS," Digest IEEE International Electron Devices Meeting, San Francisco, pp. 345–348, 1992.) Similarly, another group, headed by S. L. Wu, has proposed a gate structure consisting of stacked-amorphous-silicon film. (See "Suppression of the Boron Penetration Induced Si/SiO$_2$ Interface Degradation by Using a Stacked-Amorphous-Silicon Film as the Gate Structure for Pmosfet," IEEE Electron Device Letters, vol. 15, no. 5, pp 160–162, May 1994.)

However, each of these efforts has failed to yield a practical solution. In particular, the electrical properties of the materials in these proposed gate structures, namely tungsten and titanium nitride, limit how low mosfet threshold voltages can be set, and thus pose a barrier to low-voltage operation, a necessity for increasing battery-life in portable computers, telephones, etc. Moreover, the electrical resistance of tungsten and titanium nitride is at least twice that of metals such as aluminum, gold, or silver.

Therefore, there remains a need not only for mosfets with lower-resistance gate structures, but also for suitable methods of making them.

SUMMARY OF THE INVENTION

To address these and other needs, the inventors developed low-resistance metal gate structures for field-effect transistors, and methods for making these structures. Specifically, one embodiment of the gate structure includes an aluminum, gold, or silver top layer to reduce gate resistance, a middle diffusion barrier layer to improve reliability, and a doped polysilicon bottom layer to facilitate low-voltage operation. Thus, the gate structure overcomes several drawbacks of both early metal gates and conventional polysilicon gates.

One method for making the low-resistance gate structure entails forming a gate insulation layer on a semiconductive channel region, forming a polysilicon structure on the gate insulation layer, and then substituting metal, preferably aluminum, gold, or silver, for at least a portion of the polysilicon structure to form the gate. In the preferred embodiment, the metal substitution involves depositing a metal layer on the polysilicon structure and then heating it and the polysilicon structure to urge cross-diffusion of the metal and polysilicon. In still other embodiments, the method includes implanting source and drain regions before depositing the metal layer, and thereby eliminates the temperature conflicts that prevented the use of metals, such as aluminum, with conventional source and drain self-alignment techniques.

DESCRIPTION OF THE PREFERRED EMBODIMENTS

The following detailed description, which references and incorporates FIGS. 1–7B, describes and illustrates specific embodiments of the invention. These embodiments, offered not to limit but only to exemplify and teach the invention, are shown and described in sufficient detail to enable those skilled in the art to implement or practice the invention. Thus, where appropriate to avoid obscuring the invention, the description may omit certain information known to those of skill in the art.

Figure 4:
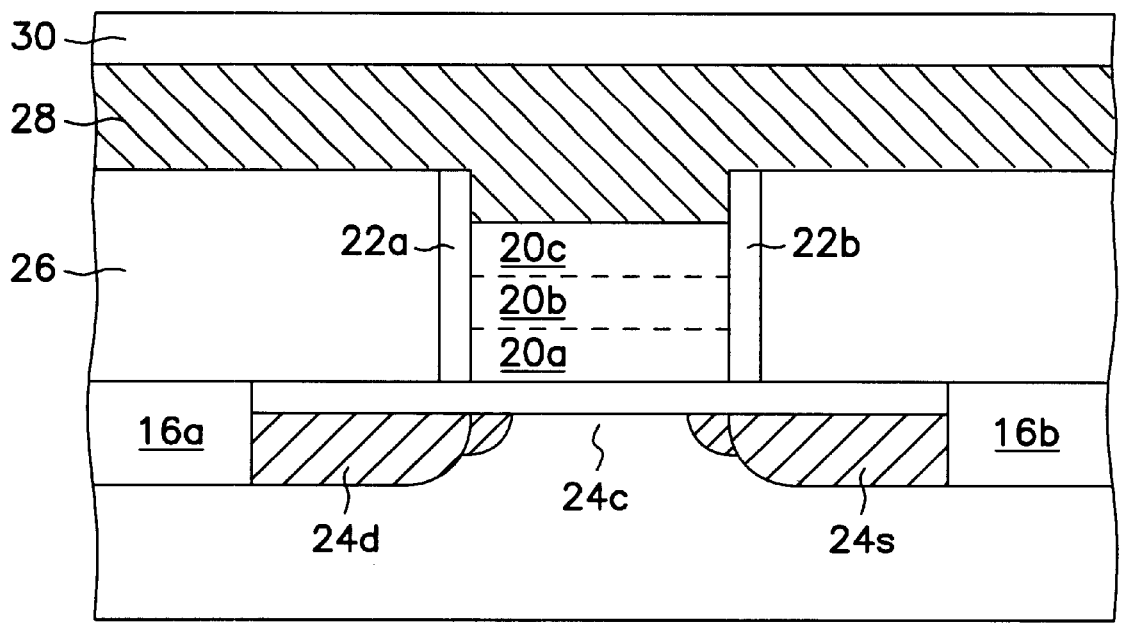
FIG. 4 is a cross-sectional view of the FIG. 3 assembly after removal of layer 18d and formation of two layers 28 and 30.
Figure 5:
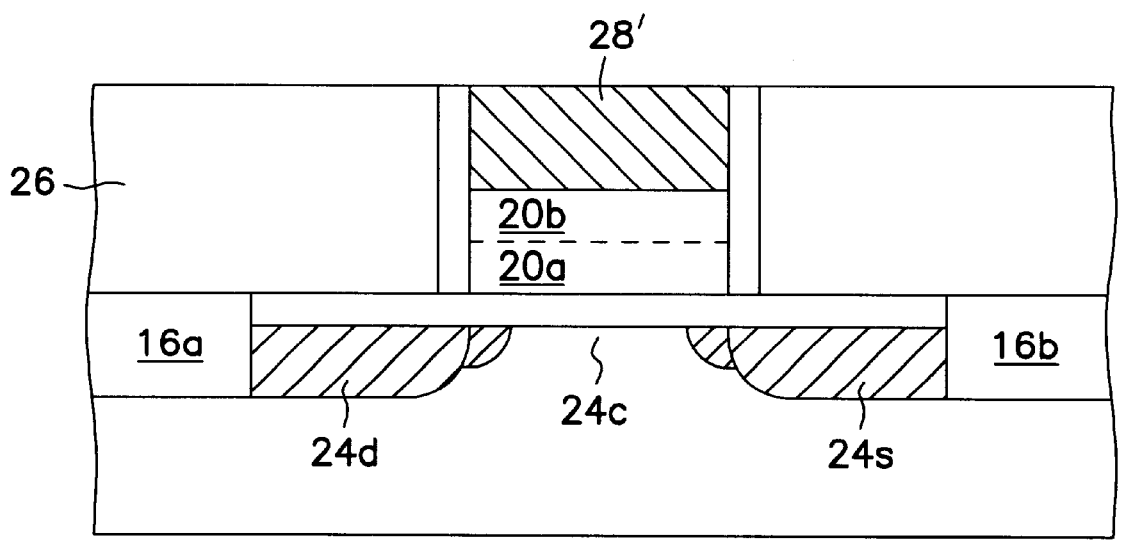
FIG. 5 is a cross-sectional view of the FIG. 4 assembly after a metal substitution reaction and planarization procedures form metal gate contact 28'.
Figure 6:
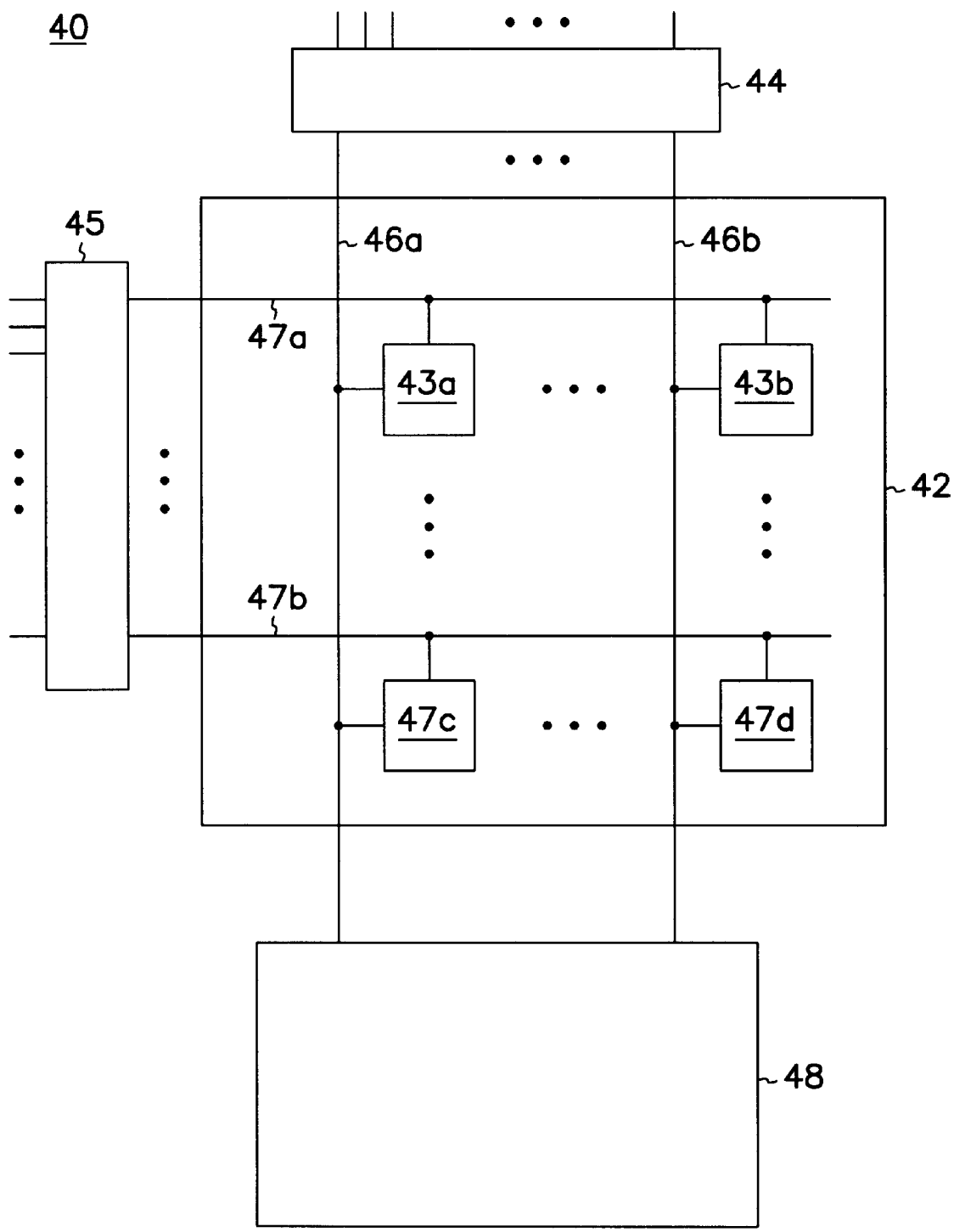
FIG. 6 is a block diagram of a generic dynamic-random-access-memory circuit that incorporates field-effect transistors having low-resistance gate structures according to the present invention.
Figure 7A:
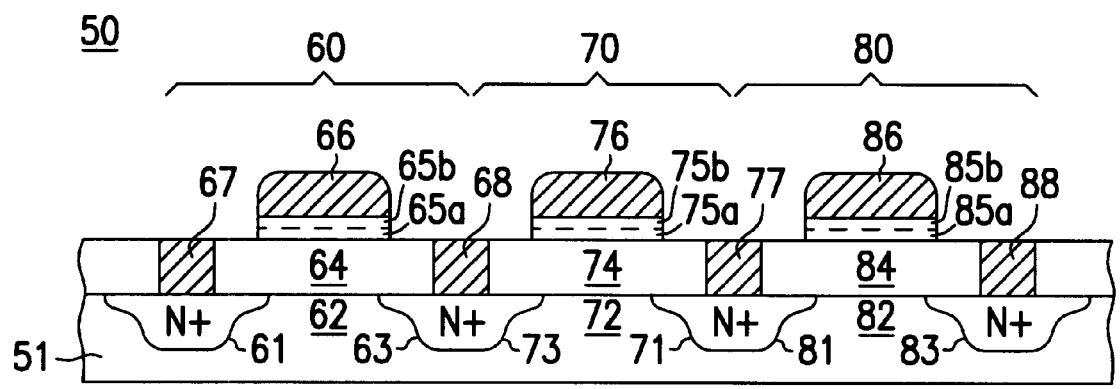
FIG. 7A is a cross-sectional view of an integrated-circuit assembly illustrating an RF application of the low-resistance gate structure of the present invention.
Figure 7B:
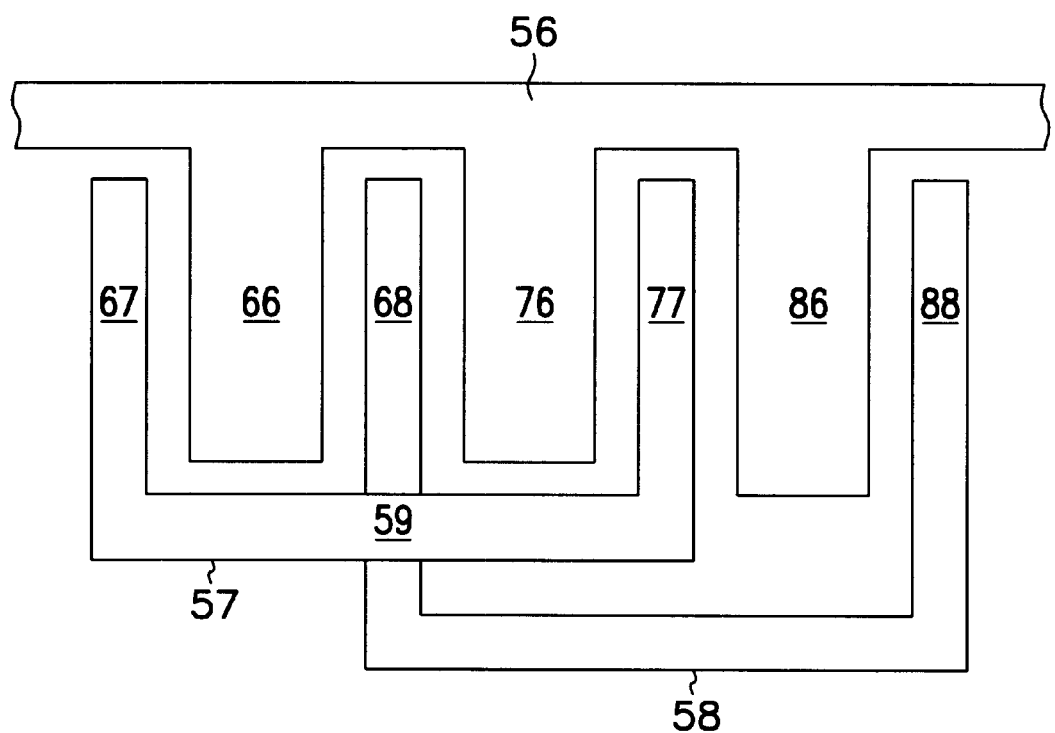
FIG. 7B is a top view of the FIG. 7A assembly, illustrating its contact layout.

FIGS. 1–5 show a number of preferred integrated-circuit assemblies, which taken collectively and sequentially, illustrate the preferred method of fabricating a field-effect transistor according to the present invention. FIG. 6 shows a preferred embodiment of a dynamic-random-access-memory circuit incorporating the field-effect transistor of the present invention. And, FIGS. 7A and 7B illustrate an RF (high-frequency) application of the invention, specifically an assembly of interdigitated field-effect transistors.

Preferred Method and Structure for Field-Effect Transistor

Figure 1:
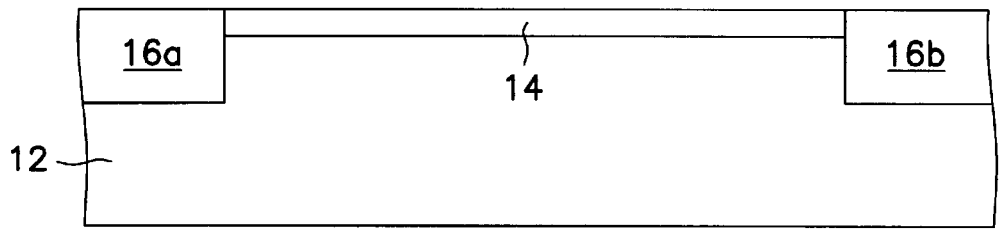
FIG. 1 is a cross-sectional view of an integrated-circuit assembly during one stage of a fabrication process.

The method, as shown in FIG. 1, begins with a known integrated-circuit assembly or structure 10, which includes a substrate 12. The term "substrate," as used herein, encompasses a semiconductor wafer as well as structures having one or more insulative, semi-insulative, conductive, or semi-conductive layers and materials. Thus, for example, the term embraces silicon-on-insulator, silicon-on-sapphire, and other advanced structures.

In addition to substrate 12, assembly 10 includes a gate insulation layer 14 and shallow-trench-isolation (STI) regions 16a and 16b. Gate insulation layer 14 and isolation regions 16a and 16b preferably consist of a silicon oxide, such as silicon dioxide. These structures are preferably formed through conventional CMOS processing.

Figure 2:
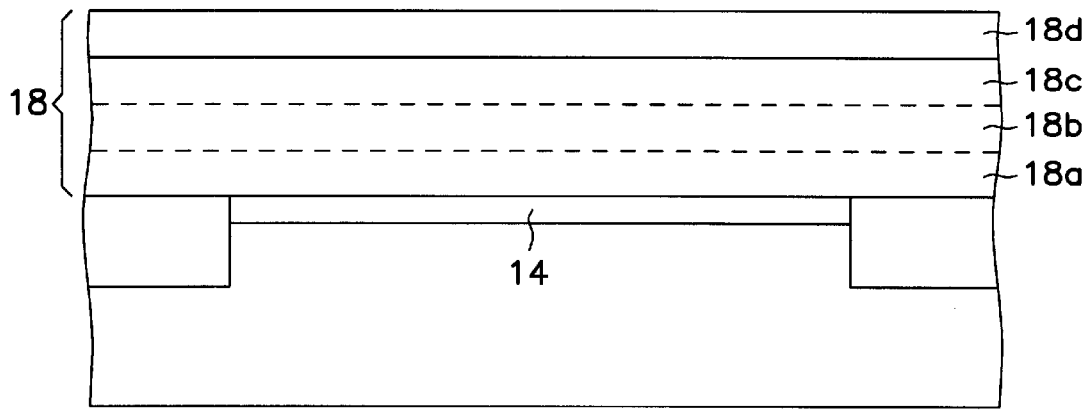
FIG. 2 is a cross-sectional view of the FIG. 1 integrated-circuit assembly after formation of four layers 18a–18d.

As shown in FIG. 2, the preferred method next forms a gate subassembly 18 comprising four layers 18a, 18b, 18c, and 18d. This formation first entails growing or depositing a 50-nanometer-thick layer 18a of doped polysilicon. For dual-work-function NMOS or PMOS devices, the polysilicon should be respectively doped with an n-type or p-type dopant to set a desired threshold voltage of the transistor under construction. The second layer is a 50-nanometer-thick, diffusion barrier layer 18b, which consists of polycrystalline or microcrystalline silicon carbide, polycrystalline silicon oxycarbide, titanium nitride, amorphous silicon or other suitable metal-diffusion-barring material. The third layer 18c, formed on layer 18b, is a 500-nanometer-thick layer of polysilicon. The method then forms the fourth layer, a 100–200 nanometer-thick silicon nitride ($Si_3N_4$) gate cap layer 18d, atop layer 18c.

Preferably, the formation of layers 18a, 18b, and 18c entails a "continuous" deposition process with temporary compositional changes to form the respective layers. In addition, layer 18c is planarized conventionally using chemical-mechanical polishing, before formation of gate cap layer 18d using chemical-vapor deposition.

Figure 3:
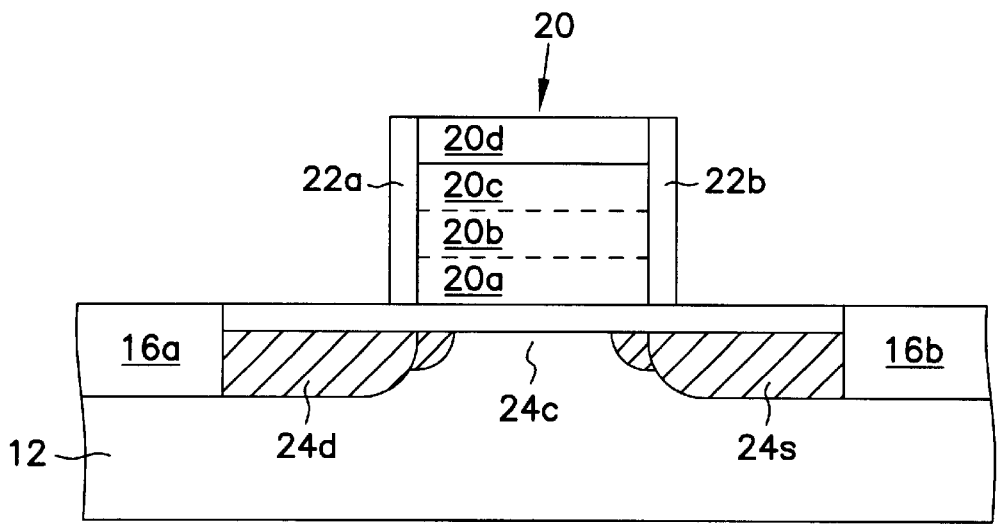
FIG. 3 is a cross-sectional view of the FIG. 2 assembly after forming a gate stack 20, sidewall spacers 22a and 22b, and drain, source, and channel regions 24d, 24c, and 24s.

FIG. 3 shows the results of forming gate subassembly 18 into a gate stack 20, adding sidewalls 22a and 22b to gate stack 20, and defining respective drain, channel, and source regions 24d, 24c, and 24s. Forming subassembly 18 into gate stack 20 involves conventionally patterning the gate and then etching through all four layers of gate subassembly 18 down to gate insulation layer 14. This process entails first etching gate cap layer 18d to form an etch mask which defines the shape and size of the gate and then etching layers 18a, 18b, and 18c to conform to the etch mask. The resulting gate stack 20 includes layers 20a–20d, which correspond in composition and thickness to respective layers 18a–18d.

Subsequent to the etching, the method forms respective self-aligned drain and source regions 24d and 24s in substrate 12, using conventional ion-implantation techniques. Although a lightly doped drain (LDD) profile is presently preferred, any desirable profile may be chosen. Other embodiments use, for example, an abrupt junction or a "fully overlapped, lightly doped drain" (FOLD) profile. To achieve the preferred profile, the method forms insulative sidewall spacers 22a and 22b on opposing sidewalls of gate stack 20, before executing the ion-implantation procedure which forms drain and source regions 24d and 24s.

Drain and source regions are formed using conventional ion implantation and subsequent high-temperature (900–1000° C.) annealing. In conventional processing, these annealing temperatures preclude the use of aluminum and other metals having melting temperatures less than the anneal temperature. The preferred implantation doses are $10^{15}$ per square centimeter. Formation of drain and source regions 24d and 24s also defines the length of semiconductive channel region 24c. Optionally, one may salicide the junctions according to conventional methods.

FIG. 4 shows the results of the next series of operations. First, the method passivates the assembly by forming an insulative fill layer 26 matching the thickness of gate stack 20. The preferred technique is thermal oxidation, oxide deposition, or a combination of the two. A planarization procedure, preferably chemical-mechanical polishing, follows to remove any passivation matter overlying gate cap 20d. The method then uses phosphoric acid to remove gate cap 20d, thereby exposing polysilicon layer 20c. At this point in the process, the integrated-circuit assembly in FIG. 4 constitutes a conventional field-effect transistor with polysilicon gate contact and self-aligned source and drain regions.

After removing gate cap 20d, the method uses evaporation, sputtering, or chemical vapor deposition to form a 1.5-micron-thick, metal layer 28 on the now-exposed polysilicon layer 18c and surrounding portions of passivation layer 26. Although the preferred embodiment forms metal layer 28 from an aluminum alloy, which includes approximately 0.3 to 4.0 percent copper and 0.3 to 1.6 percent silicon to reduce electromigration of the aluminum at high current levels, other embodiments (described below) use gold or silver. Indeed, the inventors believe that virtually any metal that will substitutionally dissolve in polysilicon or a polysilicon germanium alloy could be used successfully.

Next as FIG. 4 shows, the method forms a 200-nanometer-thick, titanium layer 30 on metal layer 28 by evaporation, sputtering, or chemical vapor deposition. In other embodiments, layer 30 is between 20 and 250 nanometers thick and comprises zirconium or hafnium, instead of titanium. Layer 30, which is optional, reduces the temperature and time necessary to complete the next step.

The next step forces a metal-substitution reaction between metal layer 28 and polysilicon layer 20c. To force this reaction between aluminum and polysilicon, the preferred method heats, or anneals, the integrated-circuit assembly to approximately 450° C. in a nitrogen, forming gas, or other non-oxidizing atmosphere for approximately 60 minutes. Heating urges diffusion or dissolution of metal layer 28 into polysilicon layer 20c and polysilicon layer 20c into the metal layer, ultimately substituting metal for most, if not all, of the polysilicon layer 20c. The substitution process is bounded by diffusion barrier layer 20b and spacers 22a and 22b.

Although here the substitution has been presented in the particularly desirable context of forming a metal gate member for a field-effect transistor, the method may be readily adapted, preferably with the provision of substitution boundary structures, to form any contact or electrode of a transistor or of another integrated-circuit component. Moreover, the substitution technique can also be applied to form a low-resistance wiring level on, for example, STI region 16a or 16b or any area of substrate 12. It may also be used to form aluminum plugs. See Hiroshi Horie et. al, "Novel High Aspect Ratio Aluminum Plug for Logic/DRAM LSIs Using Polysilicon-Aluminum Substitute (PAS)," (Technical Digest IEEE International Electron Devices Meeting, San Francisco, pp. 946–948, 1996) which is incorporated herein by reference.

At the conclusion of the substitution reaction, the method removes superficial polysilicon and remaining portions of layers 28 and 30 through conventional planarization. FIG. 5 shows the resulting low-resistance composite gate structure comprising a low-resistance metal gate contact 28' atop polysilicon diffusion barrier 20b, which itself lies atop doped polysilicon layer 20a. In contrast to conventional gates which have a relatively high-resistance polysilicon gate contact, this preferred gate structure provides a conductive metal layer, which has a much lower electrical resistance. Estimates are that the electrical resistance of the preferred gate structure is less than half that of conventional polysilicon gates.

With completion of the composite gate structure, conventional techniques may be used to form drain and source contacts (not shown). Additionally, conventional interconnection techniques may be used to connect metal gate contact 28' and the drain and source contacts to each other, to one or more contacts of other similar or different transistors, or to other components to make a complete integrated circuit. The preferred method ultimately concludes by heat-treating the integrated circuit for one to six hours at a temperature between 100 and 200° C. This heat treatment, which preferably occurs after packaging the integrated circuit in a protective housing, ensures that the metal gate contacts as well as other metal interconnections have minimum resistivity.

Other embodiments of the field-effect transistor and fabrication method form metal gate contact 28' from metals other than the preferred aluminum alloy. For example, other embodiments form the gate contact from more conductive, but costlier metals, such as gold and silver. In these embodiments, layers 18c and 20c comprises a polycrystalline silicon-germanium alloy with 10 to 60 percent germanium. These embodiments require different annealing temperatures to effect the metal substitution reaction. In general, the annealing, or substitution, temperature should not exceed the eutectic temperature of the metallic system comprising metal layer 28 and layer 18c. In particular, to form a gold gate contact one would form layer 28 from gold and anneal at approximately 300° C., and to form a silver gate contact one would form layer 28 from silver and anneal at approximately 500–600° C. In these embodiments, it is also preferable to use zirconium, which has a lower solubility than titanium and hafnium in silver and gold, to form optional layer 30. In the aluminum embodiment, layer 18c may also comprise polysilicon and germanium, in which case the anneal temperature is reduced to approximately 400° C., instead of 450° C.

In addition, other embodiments omit barrier layer 20b. In contrast to the preferred embodiment where this layer not only prevents diffusion of gate metal into gate insulation 14, but also facilitates control of the metal-substitution process. Embodiments lacking barrier layer 20b are somewhat less reliable and more difficult to make.

Preferred Embodiment of an Integrated Memory Circuit Incorporating the Field-Effect Transistor FIG. 6 shows one example of the unlimited number of applications for transistors having the low-resistance gate structure of the present invention: a generic dynamic-random-access-memory (DRAM) circuit 40. DRAM circuit 40 includes a number of subcircuits, which typically comprise one or more field-effect transistors. More precisely, DRAM circuit 40 includes a memory array 42 which comprises a number of memory cells 43, a column address decoder 44, and a row address decoder 45, bit lines 46, word lines 47, and voltage-sense-amplifier circuit 48 coupled in conventional fashion to bit lines 46.

In the preferred embodiment, each of the memory cells, the address decoders, and the amplifier circuit includes one or more field-effect transistors that has the low-resistance gate structure of the present invention. However, in other embodiments, only one of the components, for example, memory array 42 or voltage-sense-amplifier circuit 48, includes field-effect transistors with the low-resistance gate structure. Circuit 40 operates according to well-known and understood principles.

Preferred Embodiment of High-Frequency Integrated-Circuit Assembly Incorporating the Field-Effect Transistor The invention also has application to RF circuits, where it is critical to provide low gate resistance. For this reason, conventional RF applications use gallium-arsenide (GaAs) field-effect transistors. However, the low-resistance gate structure of the present invention makes it possible to use silicon CMOS field-effect transistors (fets), instead of GaAs fets, in RF applications, such as low-noise amplifiers, mixers, oscillators, and power amplifiers. In such applications, fets having the low-resistance gate structure of the present invention provide performance comparable to GaAs fets with the advantage of higher-density integration.

FIG. 7A and 7B show respective cross-sectional and top views of a novel portion of an integrated-circuit assembly 50 for a conventional high-frequency amplifier, mixer, oscillator, or power amplifier. (Complete circuits for these devices are well-known and thus need not be reproduced here.) Assembly 50 features substantially identical, n-channel CMOS fets 60, 70, and 80 which have interdigitated drain and source regions. More particularly, fet 60 has respective drain, channel, and source regions 61, 62, and 63 in substrate 51. Fet 60 shares source 63 with fet 70, which similarly shares drain 71 with fet 80. In successive layers atop channel region 62 lie gate insulation layer 64, doped polysilicon layer 65a, diffusion barrier layer 65b, and metal gate contact 66. The gate structures of fets 70 and 80 follow similarly with respective metal gate contacts 76 and 86, diffusion barrier layers 75b and 85b, doped polysilicon layers 75a and 85a, and gate insulation layers 74 and 84. The metal gate contacts are preferably formed and composed as detailed above. (Note that for clarity, structures analogous to sidewall spacers 22a and 22b and passivation layer 26 have been omitted from the figure.)

FIG. 7A also shows the cross-section of contacts 67, 68, 77, and 88. Drain contact 67 contacts drain region 61 of fet 60; source contact 67 contacts source region 63 of fet 60 and source region 73 of fet 70; drain contact 77 contacts drain region 71 of fet 70 and drain region 81 of fet 80; and source contact 88 contacts source region 83.

FIG. 7B presents a top view of the assembly, which details the interconnections of the metal gate contacts, the drain contacts, and the source contacts. Specifically, FIG. 7B shows that metal gate contacts 66, 76, and 86 are electrically connected to gate metal interconnect 56, to form a comb-like interconnect structure with the metal gate contacts as teeth. In addition, FIG. 7B shows that drain contacts 67 and 77 are electrically connected to each other by a metal interconnect 57, and source contacts 68 and 88 are electrically connected via a metal interconnect 58. Interconnect 57 includes a cross-over 59, preferably an air bridge, to isolate interconnect 57 from interconnect 58. Interconnects 56 and 57 and cross-over 59 are formed using conventional interconnection processes.

CONCLUSION

Embodiments of the present invention provide practical structures and fabrication methods for field-effect transistors with metal gates. One specific gate structure includes an aluminum, gold, or silver top layer to reduce gate resistance, a middle diffusion barrier layer to improve reliability, and a doped polysilicon bottom layer to facilitate low-voltage operation. One method embodiment forms source and drain regions prior to formation of the metal gate via a metal substitution technique, thereby precluding exposure to the metal-melting temperatures occurring during source and drain formation. Thus, the present invention overcomes drawbacks of early metal-gated transistors which were unreliable and difficult to manufacture, contemporary transistors which have more-resistive polysilicon gates, and recently proposed gate structures that prevent low-voltage operation.

The embodiments described above are intended only to illustrate and teach one or more ways of practicing or implementing the present invention, not to restrict its breadth or scope. The actual scope of the invention, which embraces all ways of practicing or implementing the invention, is defined only by the following claims and their equivalents.

What is claimed is:

1. An integrated-circuit assembly for making an electrode for a transistor, the assembly comprising:

a semiconductive layer;

a metal-substitutable layer adjacent the semiconductive layer;

a first metal layer contacting the metal-substitutable layer, wherein the metal-substitutable layer and the first metal layer comprise materials susceptible to cross-diffusion at certain temperatures;

a doped polysilicon layer contacting the semiconductive layer;

a diffusion barrier layer between the doped polysilicon layer and the metal-substitutable layer; and a second metal layer contacting the first metal layer, the second metal layer including at least one of hafnium, zirconium, and titanium.

2. The assembly of claim 1 wherein the metal-substitutable layer comprises at least one of polysilicon and germanium, and the first metal layer comprises at least one of aluminum, gold, and silver.

3. The integrated-circuit assembly of claim, wherein the first metal layer consists essentially of gold, silver, or aluminum.

4. The integrated-circuit assembly of claim 1, wherein the metal-substituted layer comprises polysilicon or a silicon-germanium composition.

5. The integrated-circuit assembly of claim 1, wherein the metal-substituble layer essentially of hafnium.

6. The integrated-circuit assembly of claim 1, wherein the second metal layer consists essentially of zirconium.

7. The integrated-circuit assembly of claim 1, wherein the second metal layer consists essentially of titanium.

8. The integrated-circuit assembly of claim 1, wherein the materials are susceptible to cross-diffusion at a temperature greater than 400°C.

9. The integrated-circuit assembly of claim 1, wherein the materials are susceptible to cross-diffusion at a temperature of about 300°C.

10. The integrated-circuit assembly of claim 1, wherein the materials are susceptible to cross-diffusion at temperatures of about 500–600°C.

11. A gate structure for a field-effect transistor, comprising:

a gate insulation structure contacting a channel region of the transistor, a doped polysilicon layer contacting the gate insulation structure, the polysilicon layer doped to define a threshold voltage for the transistor; a diffusion barrier layer adjacent the doped polysilicon layer and comprising at least one of a silicon carbide, a silicon oxycarbide, and an amorphous silicon; and a metal layer contacting the diffusion barrier layer.

12. The gate structure of claim 11 wherein the metal layer comprises at least one of aluminum, gold, and silver.

13. The gate structure of claim 11, wherein the diffusion barrier layer consists essentially of silicon carbide.

14. The gate structure of claim 11, wherein the diffusion barrier layer consists essentially of a silicon carbide.

15. The gate structure of claim 11, wherein the diffusion barrier layer consists essentially of an amorphous silicon.

16. The gate structure of claim 11 wherein the metal layer consists essentially of aluminum.

17. The gate structure of claim 11 wherein the metal layer consists essentially of gold.

18. The gate structure of claim 11 wherein the metal layer consists essentially of silver.

19. An integrated memory circuit comprising:

a memory array having a plurality of memory cells;

an address decoder coupled to the memory cells;

a plurality of bit lines coupled to the memory cells;

a voltage-sense-amplifier circuit coupled to the bit lines; and wherein at least one of the memory cells and the voltage-sense amplifier circuit includes a field effect transistor comprising:

a gate insulation structure contacting a channel region of the transistor;

a doped polysilicon layer contacting the gate insulation structure, the polysilicon layer doped to define a threshold voltage for the transistor;

a diffusion barrier layer adjacent the doped polysilicon layer; and a metal layer contacting the diffusion barrier layer adn comprising at least one of gold and silver.

20. The integrated memory circuit of claim 19, wherein the diffusion barrier layer consists essentially of silicon carbide.

21. The integrated memory circuit of claim 19, wherein the diffusion barrier layer consists essentially of an amorphous silicon.

22. The integrated memory circuit of claim 19, wherein the diffusion barrier layer consists essentially of an amorphous silicon.

23. The integrated memory circuit of claim 19, wherein the metal layer consists essentially of gold.

24. The integrated memory circuit of claim 19, wherein the metal layer consists essentially of silver.

25. An integrated-circuit assembly, comprising:

a plurality of field-effect transistors formed on a silicon substrate, with at least two transistors sharing a common source or drain region; and wherein at least one transistor includes:

a gate insulation structure contacting a channel region of the one transistor;

a doped polysilicon layer contacting the gate insulation structure, the polysilicon layer doped to define a threshold voltage for the one transistor; and a diffusion barrier layer adjacent the doped polysilicon layer; and a metal layer contacting the diffusion barrier layer and comprising at least one of gold and silver.

26. The integrated-circuit assembly of claim 25, wherein the diffusion barrier layer consists essentially of a silicon carbide.

27. The integrated-circuit assembly of claim 25, wherein the diffusion barrier layer consists essentially of a silicon oxycarbide.

28. The integrated-circuit assembly of claim 25, wherein the diffusion barrier layer consists essentially of an amorphous silicon.

29. The integrated-circuit assembly of claim 25, wherein the metal layer consists essentially of gold.

30. The integrated-circuit assembly of claim 25, wherein the metal layer consists essentially of gold, silver, or a aluminum.

31. An integrated-circuit assembly for making an electrode for a transistor, the assembly comprising:

a semiconductive layer;

a metal-substitutable layer adjacent the semiconductive layer and comprising at least one of polysilicon and germanium oxide;

a first metal layer contacting the metal-substitutable layer and comprising materials susceptible to cross-diffusion at certain temperatures with one or more portions of the metal-substitutable layer;

a doped polysilicon layer contacting the semiconductive layer;

a diffusion barrier layer between the doped polysilicon layer and the metal-substitutable layer; and a second metal layer contacting the first metal layer, the second metal layer including at least one of hafnium, zirconium, and titanium.

32. The integrated-circuit assembly of claim 31, wherein the first metal layer consists essentially of gold, silver, or aluminum.

33. The integrated-circuit assembly of claim 31, wherein the metal-substitutable layer comprises polysilicon or a silicon-germanium composition.

34. The integrated-circuit assembly of claim 31, wherein the materials are susceptible to cross-diffusion at a temperature greater than 400°C.

35. The integrated-circuit assembly of claim 31, wherein the materials are susceptible to cross-diffusion at a temperature of about 300°C.

36. The integrated-circuit assembly of claim 31, wherein the materials are susceptible to cross-diffusion at temperatures of about 500–600°C.

37. A gate structure for a field-effect transistor, comprising:

a gate insulation structure contacting a channel region of the transistor;

a doped polysilicon layer contacting the gate insulation structure, the polysilicon layer doped to define a threshold voltage for the transistor;

a diffusion barrier layer adjacent the doped polysilicon layer and consisting essentially of at least one of a silicon carbide, a silicon oxycarbide, and an amorphous silicon; and a gold layer contacting the diffusion barrier layer.

38. The gate structure of claim 37, wherein the gold layer consists essentially of gold.

39. A gate structure for a field-effect transistor, comprising:

a gate insulation structure contacting a channel region of the transistor;

a doped polysilicon layer contacting the gate insulation structure, the polysilicon layer doped to define a threshold voltage for the transistor;

a diffusion barrier layer adjacent the doped polysilicon layer and comprising at least one of a silicon carbide, a silicon oxycarbide, and an amorphous silicon; and a silver layer contacting the diffusion barrier layer.

40. The gate structure of claim 37, wherein the silver layer consists essentially of silver.

41. A gate structure for a field-effect transistor, comprising:

a gate insulation structure contacting a channel region of the transistor;

a doped polysilicon layer contacting the gate insulation structure, the polysilicon layer doped to define a threshold voltage for the transistor;

a diffusion barrier layer adjacent the doped polysilicon layer and consisting essentially of a silicon carbide; and a silver or gold layer contacting the diffusion barrier layer.

* * * * *

UNITED STATES PATENT AND TRADEMARK OFFICE
CERTIFICATE OF CORRECTION

| | |
|---|---|
| PATENT NO. | : 6,492,694 B2 |
| DATED | : December 10, 2002 |
| INVENTOR(S) | : Leonard Forbes and Wendell P. Noble Jr. |

It is certified that error appears in the above-identified patent and that said Letters Patent is hereby corrected as shown below:

<u>Title page,</u>
Item [56], References Cited, U.S. PATENT DOCUMENTS,
"4,959,705 A", delete "27/522" and insert -- 257/522 -- therefor.
"5,563,448 A", delete "10/1996" and insert -- 10/1995 -- therefor.
OTHER PUBLICATIONS,
"Zhao, X., et al.," delete "466-471" and insert -- 467-471 -- therefor.
"Hiraki, A., et al.," delete "Studiedby" and insert -- Studied by -- therefor.
"Horie, H. et al.," delete "Ration" and insert -- Ratio -- therefor.
"Kothandaraman, M., et al.," delete "865-878" and insert -- 875-878 -- therefor.
"Mohri, M., et al.," delete "*IEIECE*" and insert -- *IEICE* -- therefor.
"Patuwathavithane, O., et al.," delete "O" and insert -- C -- therefor.
"Yee, A., et al.," delete "12" and insert -- 11 -- therefor.

<u>Column 5,</u>
Line 16, delete "28" and insert -- 26 -- therefor.
Line 31, delete "et. al" and insert -- et al. -- therefor.

<u>Column 8,</u>
Line 17, insert -- 1 -- after "claim".
Line 25, delete "metal-substituble layer" and insert -- second metal layer consists -- therefor.
Line 42, delete "," after "transistor" and insert -- ; -- therefor.

Signed and Sealed this

Twenty-sixth Day of August, 2003

JAMES E. ROGAN
*Director of the United States Patent and Trademark Office*